United States Patent
Nishikawa et al.

(10) Patent No.: US 8,125,786 B2
(45) Date of Patent: Feb. 28, 2012

(54) MEMORY CARD

(75) Inventors: Hidenobu Nishikawa, Nara (JP); Daido Komyoji, Nara (JP); Hiroyuki Yamada, Osaka (JP); Yutaka Nakamura, Kyoto (JP); Shuichi Takeda, Yamagata (JP); Yasuharu Kikuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 903 days.

(21) Appl. No.: 12/160,301

(22) PCT Filed: Jan. 26, 2007

(86) PCT No.: PCT/JP2007/051242
§ 371 (c)(1),
(2), (4) Date: Jul. 8, 2008

(87) PCT Pub. No.: WO2007/086494
PCT Pub. Date: Aug. 2, 2007

(65) Prior Publication Data
US 2009/0009976 A1 Jan. 8, 2009

(30) Foreign Application Priority Data

Jan. 30, 2006 (JP) ................................ 2006-020292
Apr. 21, 2006 (JP) ................................ 2006-117588

(51) Int. Cl.
*H05K 1/14* (2006.01)
(52) U.S. Cl. .................. 361/737; 361/728; 361/803
(58) Field of Classification Search .................. 361/737, 361/760, 748, 720, 728–730, 752, 796, 800, 361/803
See application file for complete search history.

(56) References Cited

U.S. PATENT DOCUMENTS

| | | | | |
|---|---|---|---|---|
| 4,005,038 A | * | 1/1977 | Minkoff | 523/103 |
| 5,061,845 A | * | 10/1991 | Pinnavaia | 235/492 |
| 5,182,879 A | * | 2/1993 | Hopkins | 43/131 |
| 5,416,358 A | * | 5/1995 | Ochi et al. | 257/666 |
| 6,200,046 B1 | * | 3/2001 | Rylander | 401/52 |
| 6,303,209 B1 | * | 10/2001 | Kobayashi | 428/141 |
| 7,131,785 B1 | * | 11/2006 | Mansouri | 401/195 |
| 7,163,962 B2 | * | 1/2007 | Woods | 516/11 |
| 7,192,985 B2 | * | 3/2007 | Woods | 516/11 |
| 7,804,163 B2 | * | 9/2010 | Hiew et al. | 257/679 |

FOREIGN PATENT DOCUMENTS

| | | | | |
|---|---|---|---|---|
| JP | 3021625 U | | 12/1995 | |
| JP | 3021625 | | 2/1996 | |
| JP | 3024428 | | 5/1996 | |
| JP | 409039469 A | * | 2/1997 | |
| JP | 09-058175 | | 3/1997 | |
| JP | 11-233606 | | 8/1999 | |
| JP | 2003-303326 | | 10/2003 | |
| JP | 2006-3955 | | 1/2006 | |

OTHER PUBLICATIONS

Chinese Office Action issued in Chinese Patent Application No. 2007800022013, mailed Feb. 5, 2010.

(Continued)

*Primary Examiner* — Hung S Bui
(74) *Attorney, Agent, or Firm* — McDermott Will & Emery LLP

(57) ABSTRACT

Memory card includes a circuit board, a component mounted on a main face of the circuit board, casing covering at least the main face of the circuit board and the component, and bittering agent retained in a roughened area provided on casing or an exposed part of the circuit board.

12 Claims, 12 Drawing Sheets

OTHER PUBLICATIONS

Japanese Office Action issued in Japanese Patent Application No. JP 2006-117588 dated Dec. 7, 2010.

Japanese Office Action issued in Japanese Patent Application No. JP 2006-020292 dated Dec. 7, 2010.

* cited by examiner

FIG. 7A
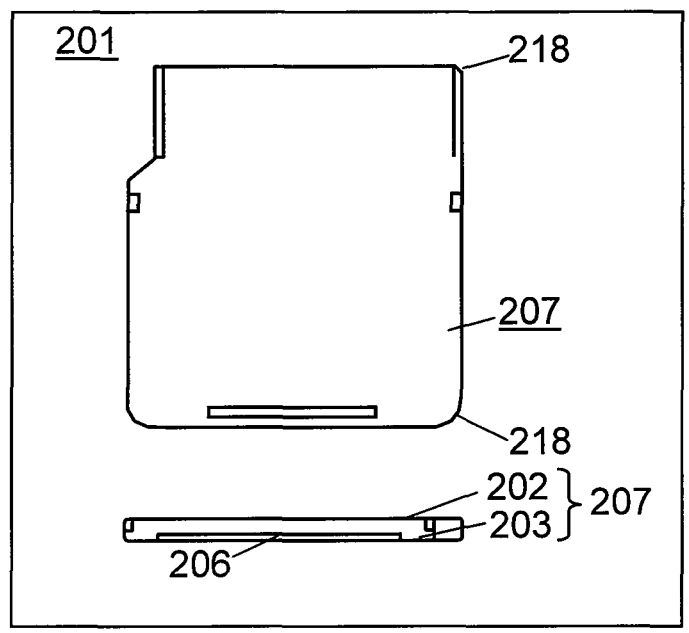
FIG. 7B  FIG. 7C  FIG. 7D
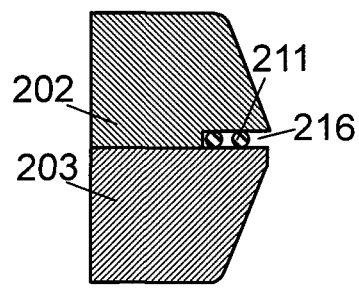 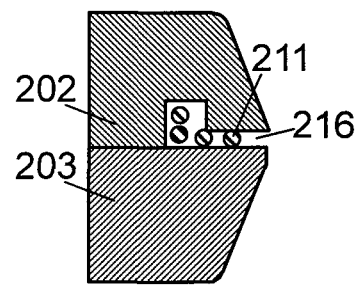 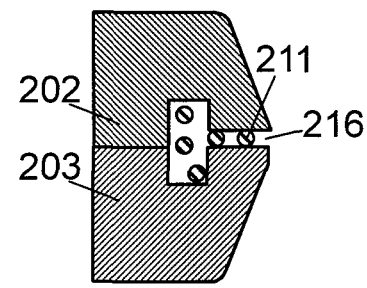

MEMORY CARD

RELATED APPLICATIONS

This application is the U.S. National Phase under 35 U.S.C. §371 of International Application No. PCT/JP2007/051242, filed on Jan. 26, 2007, which in turn claims the benefit of Japanese Application Nos. 2006-020292 and 2006-117588, filed on Jan. 30, 2006 and Apr. 21, 2006, respectively, the disclosures of which Applications are incorporated by reference herein.

TECHNICAL FIELD

The present invention relates to portable and mobile memory cards, and more particularly to memory cards designed to prevent their accidental ingestion.

BACKGROUND ART

Memory cards with built-in memory chips are commonly used as recording media and for storing information. They are highly portable, and are thus commonly employed as recording media in mobile electronic devices such as personal digital terminals and mobile phones. These mobile electronic devices, as they become smaller and thinner, will require further downsizing of memory cards to afford better portability.

On the other hand, smaller memory cards carry an increased risk of accidental ingestion, typically by children. Accordingly, technology to prevent the accidental ingestion of memory cards has been proposed. (For example, refer to Patent Document 1).

In the memory card disclosed in Patent Document 1, an emetic agent is first mixed with a resin material that is then used for making the memory card casing by insert-molding so as to form a casing containing the emetic agent. In this way, the emetic agent contained in the casing surface comes into contact with the tongue if the memory card is placed in the mouth, and results in immediate spitting-out of the memory card. Patent Document 1 further discloses mixing of an emetic agent in the ink used for printing on the surface of a memory card to prevent its accidental ingestion.

In Patent Document 1, the emetic agent is exposed on the casing surface or ink surface of the memory card, and may thus attach to the fingertip of the user when the user handles the memory card, resulting in removal of the emetic agent from the surface of the memory card. As a result, if a child puts the memory card in his/her mouth, it will take some time for the emetic agent contained inside the casing or ink to leak out to the mouth. Accordingly, accidental ingestion of memory card cannot be reliably prevented.

Still more, insert-molding is conducted under conditions in which the emetic agent is contained in the resin material in the memory card disclosed in Patent Document 1. The quality of the emetic agent may thus be altered or degraded as a result of heat being applied while molding the casing. This may result in loss of the emetic effect generated if the memory card is placed in the mouth. In addition, resin material or ink containing the emetic agent needs to be prepared separately, complicating the process of manufacturing the memory card.

[Patent Document 1] Japanese Patent Unexamined Application No. 2006-3955.

SUMMARY OF THE INVENTION

A memory card of the present invention includes a circuit board, components mounted on a main face of the circuit board, a casing that covers at least the main face of circuit board and the components, and a bittering agent retained in a roughened area provided on the casing or an exposed area of the circuit board.

With this structure, the bittering agent is firmly fixated and retained in at least the roughened area of the casing surface. Accordingly, a tongue securely touches the bittering agent, which is an emetic agent, when the memory card is placed in a mouth, resulting in immediate spitting-out of the memory card. In addition, commercially-available bittering agent can be used. This allows further cost reduction of the memory card.

Still more, a memory card of the present invention includes a circuit board, components mounted on a main face of the circuit board, a casing that covers at least the main face of circuit board and the components, and a bittering agent retained in a bonding part between the casings or a bonding part between the circuit board and the casing.

With this structure, the bittering agent retained in the bonding part is prevented from being attached to the finger or being removed. Accordingly, the bittering agent can be reliably retained over a long period of time.

Furthermore, a memory card of the present invention includes a circuit board, components mounted on a main face of the circuit board, a casing that covers at least the main face of circuit board and the components, an identification part attached to the casing or the circuit board, and a bittering agent retained between the identification part and the casing or between the identification part and the circuit board.

With this structure, the bittering agent is prevented from being attached to the hand or being removed because the bittering agent is retained between the identification part and the casing or between the identification part and the circuit board. Accordingly, the bittering agent can be reliably retained, achieving the memory card that can prevent accidental ingestion over a long period of time.

BRIEF DESCRIPTION OF DRAWINGS

FIG. 7A is a front view and a top side view of a memory card in accordance with a second exemplary embodiment of the present invention.

FIG. 7B is a partial magnified sectional view of a bonding part between casings that has a specific structure for retaining a bittering agent in the memory card in accordance with the second exemplary embodiment of the present invention.

FIG. 7C is a partial magnified sectional view of a bonding part between the casings that has a specific structure for retaining the bittering agent in the memory card in accordance with the second exemplary embodiment of the present invention.

FIG. 7D is a partial magnified sectional view of a bonding part between the casings that has a specific structure for retaining the bittering agent in the memory card in accordance with the second exemplary embodiment of the present invention.

Figure 1A:
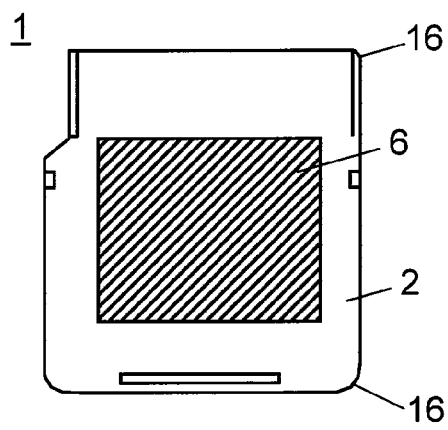
FIG. 1A is a front view of a memory card in accordance with a first exemplary embodiment of the present invention.

REFERENCE MARKS IN THE DRAWINGS 1, 21, 201, 301, 401, 401a, 401b, 401c, 401d Memory card
2, 202, 471 Upper casing
3, 203, 472 lower casing
4, 304, 402 Circuit board
5, 4221 Electrode terminal
6, 206, 306 Logo area
7, 207, 307, 477 Casing
8 Transfer head
9 Transfer unit
10 Stage
11, 211, 311, 482 Bittering agent
12 Heater
13 Pearskin pattern
14 Fine linear groove
15 Foamed concavo-convex pattern
16, 218, 318 Corner
17 Mounting-component
216, 316 Space
403 First semiconductor chip
405 Second semiconductor chip
406 Chip component
408, 408a Identification part (label)
421 Top face
422 Bottom face
433, 453 Bump
481 Adhesive layer
482a Adhesion layer
483 Fine concavity
484 Identification part (coloring layer)
4211, 4212, 4213 Electrode
4710 Concavity
4711 Surface

DETAILED DESCRIPTION OF PREFERRED EMBODIMENTS

Exemplary embodiments of the present invention are described below with reference to drawings.

First Exemplary Embodiment

Figure 1B:
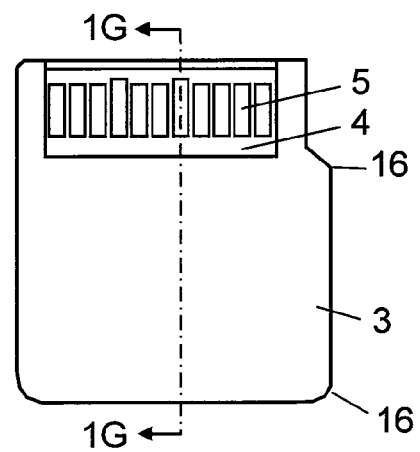
FIG. 1B is a rear view of the memory card in accordance with the first exemplary embodiment of the present invention.
Figure 1C:
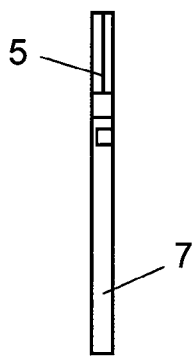
FIG. 1C is a left side view of the memory card in accordance with the first exemplary embodiment of the present invention.
Figure 1D:
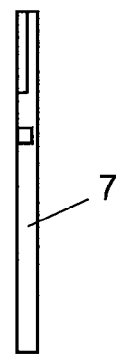
FIG. 1D is a right side view of the memory card in accordance with the first exemplary embodiment of the present invention.
Figure 1E:
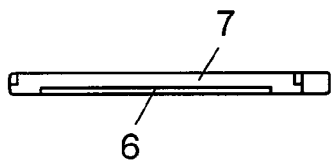
FIG. 1E is a top side view of the memory card in accordance with the first exemplary embodiment of the present invention.
Figure 1F:
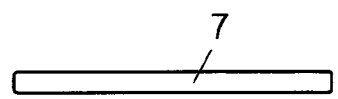
FIG. 1F is a bottom side view of the memory card in accordance with the first exemplary embodiment of the present invention.
Figure 1G:
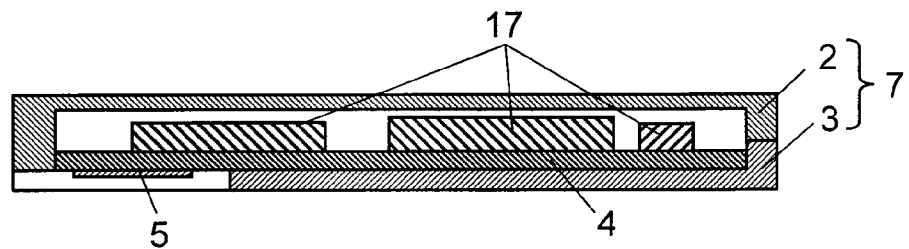
FIG. 1G is a sectional view taken along line 1G-1G in FIG. 1B.

FIGS. 1A to 1G illustrate an appearance of a memory card in the first exemplary embodiment of the present invention. FIG. 1A is a front view, FIG. 1B is a rear view, FIG. 1C is a left side view, FIG. 1D is a right side view, FIG. 1E is a top side view, FIG. 1F is a bottom side view, and FIG. 1G is a sectional view taken along line 1G-1G in FIG. 1B.

Memory card 1 shown in FIGS. 1A to 1G is, for example, 20 mm wide, 21.5 mm long, and 1.4 mm thick. In general, this memory card is called a 'mini SD memory card' (mini secure digital memory card). This memory card 1 has a shape and size determined in accordance with the standard, and is commonly used in mobile devices such as mobile phone terminals.

In memory card 1, as shown in FIG. 1G, circuit board 4, on which mounting-components 17 including a semiconductor chip and chip component are placed, is built into casing 7. Multiple electrode terminals 5 for transmitting electrical signals to and from outside are also provided on circuit board 4. Only electrode terminals 5 on circuit board 4 are exposed from casing 7.

Casing 7 of memory card 1 includes upper casing 2 and lower casing 3. Each casing is independently molded by injection molding using a thermoplastic resin such as polycarbonate/ABS. Other than polycarbonate/ABS, casing 7 may also be made of a thermoplastic resin such as polyamide/ABS, polyphenylene phthalate (PPS), polyethylene terephthalate, and liquid crystal polymer. In addition, insert-molding may be applied to molding of the casing using thermoplastic resin in the following way. The circuit board, on which mounting-components including a semiconductor chip are mounted in advance, is placed in a mold, and insert-molding using a thermoplastic resin is applied to both faces of the circuit board, excluding the electrode terminals, or to only one face of the circuit board so as to cover mounting-components 17 including a semiconductor chip. Alternatively, the circuit board, on which mounting-components including a semiconductor chip are mounted, is placed in a mold, and transfer molding using a thermosetting resin such as epoxy resin may also be applied for insert-molding.

Circuit board 4, on which mounting-components including a semiconductor chip are mounted in advance, is housed in upper casing 2 and lower casing 3. Memory card 1 is completed by bonding upper casing 2 and lower casing 3.

Memory card 1 as manufactured above has logo area 6 on at least upper casing 2 or lower casing 3 of casing 7, as shown in FIG. 1A. A pattern using characters, symbols, and marks indicating the name of the memory card, its storage capacity, logo, and so on is illustrated on this logo area 6, typically using ink printing or laser marking. This makes each memory card, including its type, identifiable.

As shown in FIGS. 1A and 1B, a roughened area made typically of a concavo-convex pattern is provided on at least a part of casing 7 consisting of upper casing 2 and lower casing 3 or an exposed area where circuit board 4 is exposed from casing 7. A bittering agent is embedded in concavities in this roughened area. Average roughness Ra of the roughened area is not less than 0.1 μm and not greater than 100 μm, and preferably not less than 1 μm and not greater than 50 μm. This roughened area is formed typically by sandblasting method. In other words, if average roughness Ra is less than 0.1 μm, fixation retention of the bittering agent is difficult. If average roughness Ra is greater than 100 μm, the bittering agent may be removed by fingerprints, which is not preferable.

The concavo-convex pattern of the roughened area and how to retain the bittering agent are described in detail below with reference to the drawings.

By the use of memory card 1 in the first exemplary embodiment, the bittering agent retained in the roughened area of the memory card causes immediate spitting-out of the memory card if a child puts the memory card in his/her mouth. This prevents accidental ingestion. In addition, retention of the bittering agent in the concavities of the roughened area suppresses any loss of the bittering agent due to transfer to the hand or dropping, and thus the effect can be reliably maintained over a long period of time. Furthermore, since the bittering agent is not altered or degraded by heat during molding of the casing, an inexpensive and reliable memory card is achievable.

A method of transferring the bittering agent to the roughened area of the memory card in the first exemplary embodiment of the present invention is described in detail with reference to FIGS. 2A and 2C. The steps up to integrating the circuit board, on which mounting-components including a semiconductor chip are mounted, into the casing are the same as ordinary steps, and thus their description is omitted below.

Figure 2A:
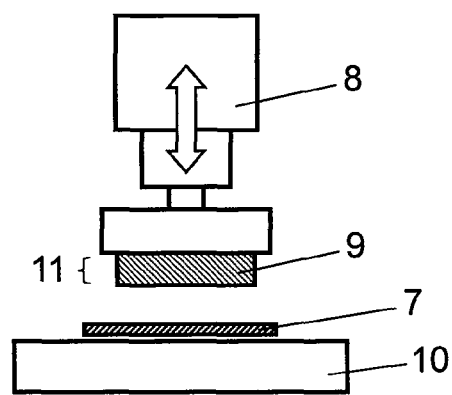
FIG. 2A illustrates a method of transferring a bittering agent to a roughened area of the memory card in accordance with the first exemplary embodiment of the present invention.

FIG. 2A illustrates the step of transferring the bittering agent to the roughened area of the memory card. FIG. 2A shows the case of transferring the bittering agent to the roughened area provided on the surface of casing 7 of the memory card. Casing 7 of memory card 1 is typically made of polycarbonate/ABS resin, and characters are written in its logo area, typically by laser marking with a YAG laser. Bittering agent 11 is generally denatonium benzoate dissolved in alcohol solution.

As shown in FIG. 2A, equipment including transfer head 8, sponge-like transfer unit 9 soaked with the bittering agent, and stage 10 is normally used for transferring the bittering agent to the roughened area. More specifically, transfer head 8 is vertically operated relative to stage 10 so as to transfer the bittering agent using the pad print method, as described below.

First, transfer unit 9 is soaked with bittering agent 11, and then memory card 1 is placed on stage 10 such that its roughened area of casing 7 to be applied with bittering agent 11 faces transfer head 8. Transfer head 8 is then lowered to transfer bittering agent 11 soaked in transfer pad 9 to the roughened area of casing 7 of memory card 1. The amount of bittering agent transferred is, for example, about 1 mg to 10 mg. The transfer position is the part of the circuit board exposed from the lower casing, excluding the electrode terminals, and the entire face or a part of the casing, or the roughened area formed on corner 16 of the substantially rectangular casing. A gap of 0.2 mm or more is preferably secured between the electrode terminals and the roughened area of the exposed circuit board where the bittering agent is applied. This prevents possible discoloration or corrosion of the electrode terminals due to transfer of the bittering agent to the electrode terminals. Other than the pad print method, the bittering agent can be transferred using ordinary methods, including the inkjet method, dispensing method, and by printing.

Figure 2B:
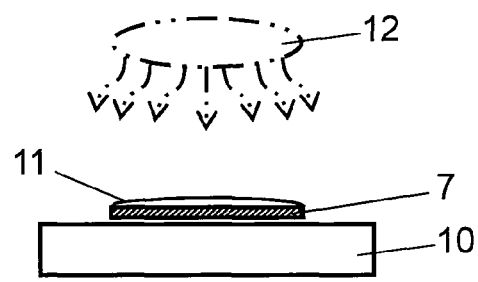
FIG. 2B illustrates a method of transferring the bittering agent to the roughened area of the memory card in accordance with the first exemplary embodiment of the present invention.
Figure 2C:
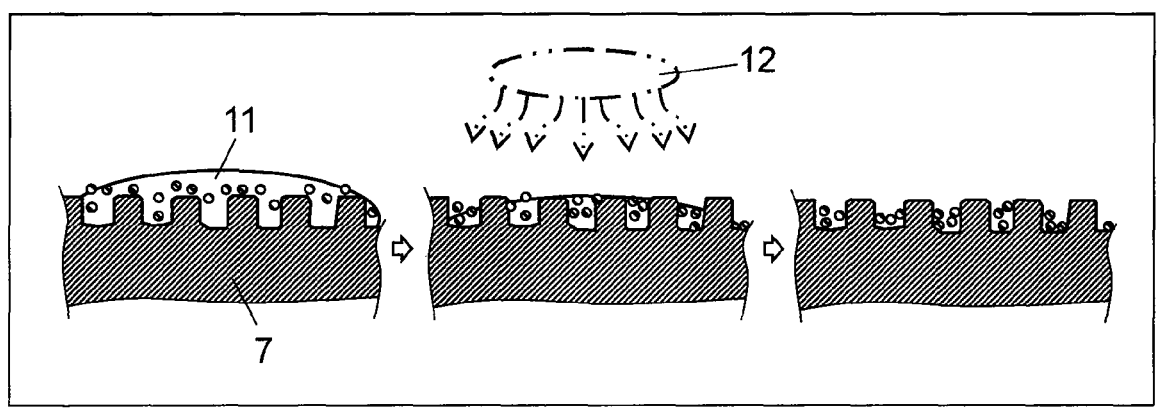
FIG. 2C is a method of transferring the bittering agent to the roughened area of the memory card in accordance with the first exemplary embodiment of the present invention.

Next, in the drying step shown in FIG. 2B, the solvent, such as alcohol, carrying bittering agent 11 transferred to the roughened area of casing 7, is evaporated by hot air using heater 12 so that only bittering agent 11 is embedded in at least the concavities of the roughened area of casing 7. FIG. 2C illustrates in detail how bittering agent 11 is embedded in the concavity of the roughened area. As the solvent evaporates, illustrated by the left-hand drawing to the right-hand drawing, bittering agent 11 is selectively embedded in the concavity.

Other than hot air, only bittering agent 11 can be embedded on casing 7 by causing evaporation, typically by natural drying, blowing gas such as air, or heating during the drying step. In particular, the use of both heating by hot air and air blowing is preferable to ensure faster drying.

As described above, the concavo-convex pattern needs to be formed on the roughened area to reliably fixate and retain bittering agent 11 in the roughened area of casing 7 of memory card 1.

Next, the concavo-convex pattern formed in the roughened area is detailed with reference to drawings.

Figure 3:
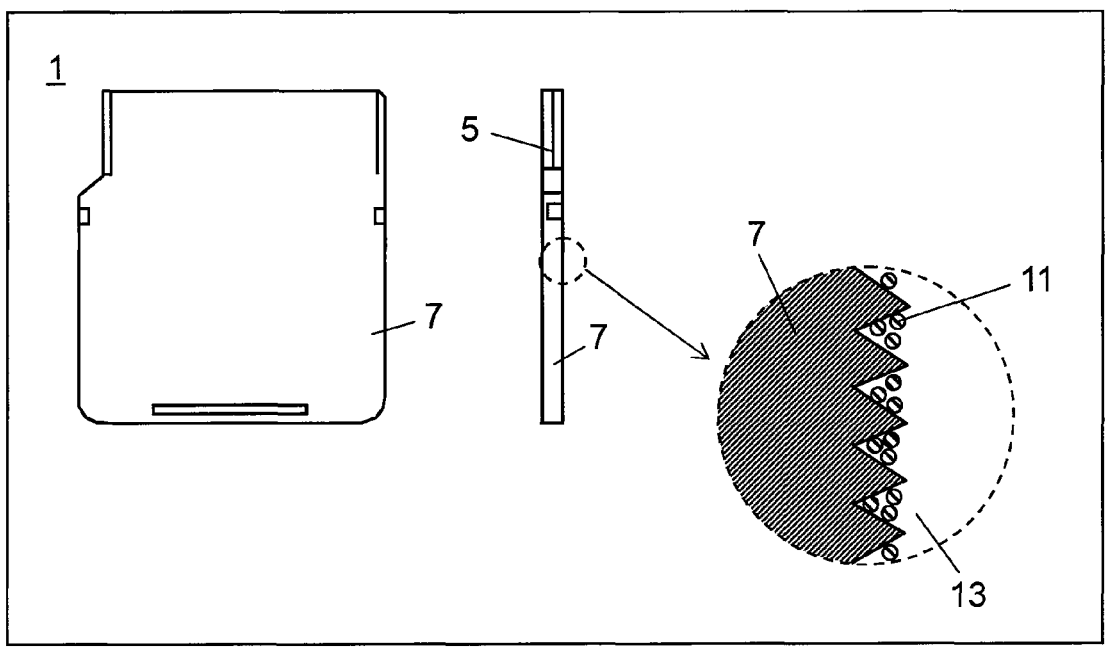
FIG. 3 is a schematic view illustrating a first example of a concavo-convex pattern of the roughened area formed on the memory card in accordance with the first exemplary embodiment of the present invention.

FIG. 3 is a schematic view illustrating a first example of the concavo-convex pattern on the roughened area formed in memory card 1. In the first example, the concavo-convex pattern is a pearskin pattern.

More specifically, as shown in the right-hand drawing in FIG. 3, the roughened area of casing 7 of memory card 1 is roughened in this pearskin pattern 13, and bittering agent 11 is embedded in it. Pearskin pattern 13 consists of conical, pyramid, such as triangular pyramid or concavities, formed discretely in the roughened area. Methods of forming a roughened area of the casing in the pearskin pattern include the formation of a pearskin pattern on molds for molding the casing. Other methods include physical processing by sandblasting, physical or dry-chemical processing by plasma treatment, and wet-chemical processing by immersion in etching liquid.

As a pretreatment, it is preferable to apply a general coupling agent such as silane series, titanate series, and aluminate series to the surface of pearskin pattern 13 on casing 7 before transferring the bittering agent. This further ensures firm attachment of bittering agent 11 within the concavities of pearskin pattern 13.

Figure 4:
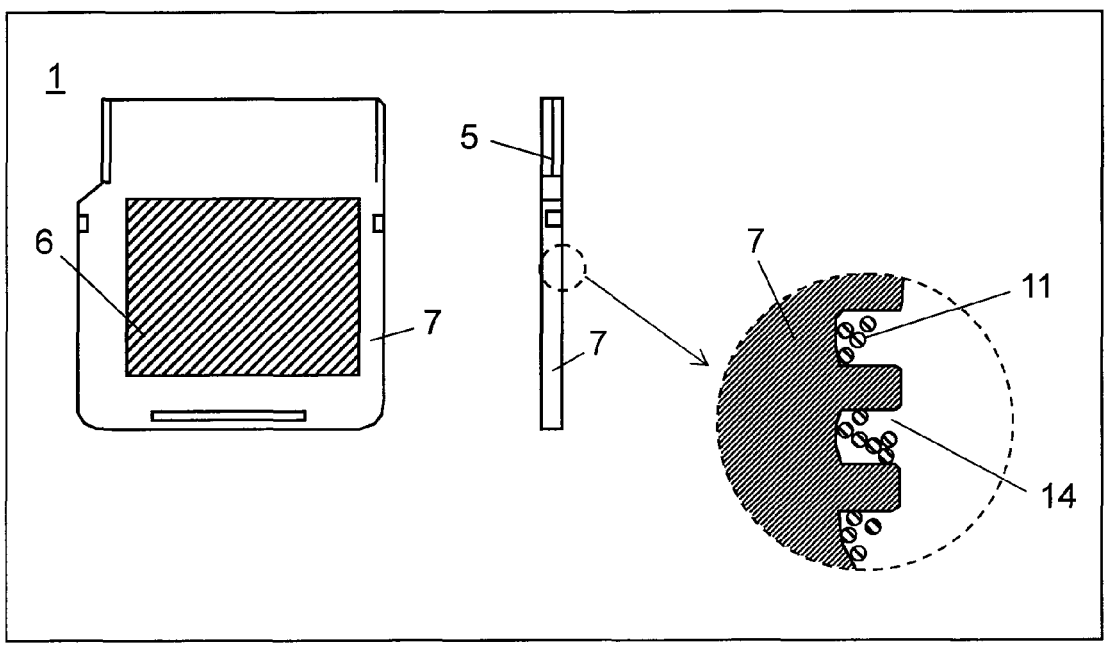
FIG. 4 is a schematic view illustrating a second example of the concavo-convex pattern of the roughened area formed on the memory card in accordance with the first exemplary embodiment of the present invention.

FIG. 4 is a schematic view of a second example of the concavo-convex pattern on the roughened area formed on memory card 1. In the second example, the concavo-convex pattern is formed of grooves, more particularly, fine linear grooves.

More specifically, as shown in the right-hand drawing in FIG. 4, fine linear grooves 14 are formed in the roughened area of casing 7 of memory card 1, and bittering agent 11 is embedded in these fine linear grooves 14. Fine linear grooves 14 are linear grooves whose bottom is at least flat. Fine linear grooves can be formed in the roughened area of the casing, typically by scanning a YAG laser, semiconductor laser, or excimer laser. If characters are formed in logo area 6 on the surface of casing 7 using laser marking, they can be formed with fine linear grooves in which the bittering agent may be embedded.

Figure 5:
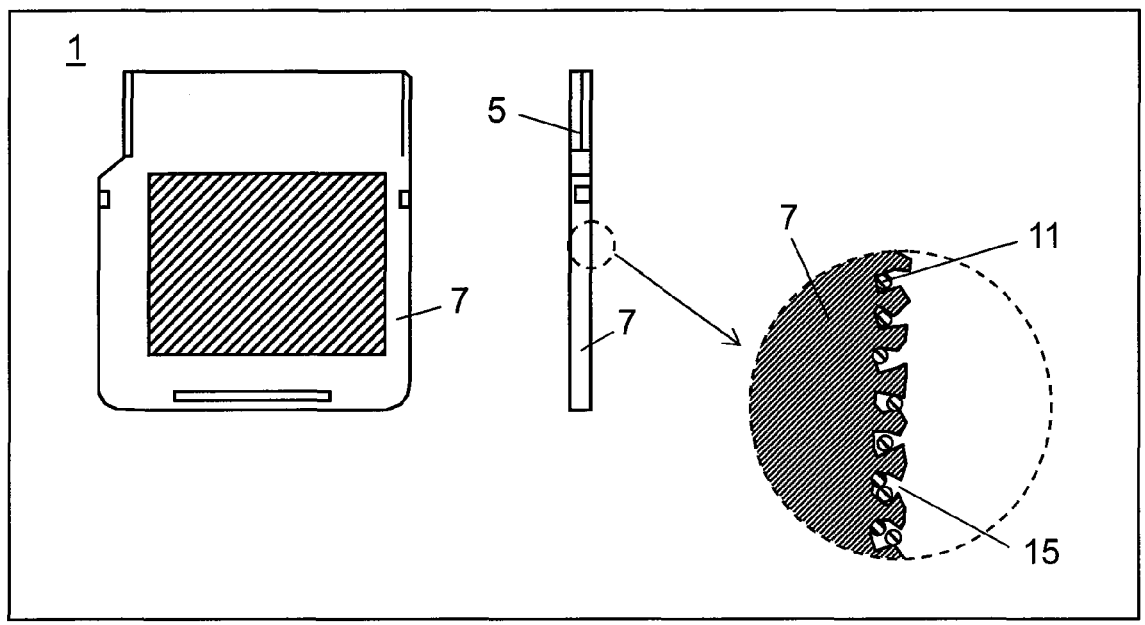
FIG. 5 is a schematic view illustrating a third example of the concavo-convex pattern of the roughened area formed on the memory card in accordance with the first exemplary embodiment of the present invention.

FIG. 5 is a schematic view of a third example of the concavo-convex pattern on the roughened area formed on memory card 1. In the third example, the concavo-convex pattern is a foamed concavo-convex pattern.

More specifically, as shown in the right-hand drawing in FIG. 5, foamed concavo-convex pattern 15 is formed in the roughened area of casing 7 of memory card 1. Bittering agent 11 is embedded in this foamed concavo-convex pattern 15. Foamed concavo-convex pattern 15 has concavities whose bottom is at least wider than its open end, and are provided discretely or linearly. The foamed concavo-convex pattern is formed on the roughened area of the casing typically by scanning a YAG laser or $CO_2$ laser that induces foaming by sudden heating and melting of the casing made of resin. If the casing is made of thermoplastic resin, the use of a YAG laser is preferable because this laser has a short wavelength that allows partial heating. If laser marking is used for writing characters on logo area 6 on the surface of casing 7, they can be formed with the foamed concavo-convex pattern in which the bittering agent may be embedded.

In this exemplary embodiment, denatonium benzoate is used as the bittering agent. However, the present invention is not limited to this substance. For example, any flavored substance that generates a bitter taste when placed in the mouth is applicable. As a substance that causes spitting-out by bitterness, it is preferable to use a natural substance or a manufactured chemical compound popularly known as a bitter substance that is also usable as food additive.

More specifically, for example, catechins that are one type of tannin, caffeine, anthocyanins, amino acids, cucurbitacins, phenylthiocarbamide, calcium, magnesium sulfate, and magnesium chloride are used as bitter-tasting substances. In addition, chemical compounds that can be used as food additives, including catechins, alkaloids, xanthines, terpenes, triterpenoids, and terpene glycosides, are broadly applicable.

Other than these bittering agents, hot-tasting agents, typically capsaicin, isothiocyanate ester, and simgrin; acidulating agents, typically citric acid, tartaric acid, fumaric acid, sodium fumarate, malic acid, and adipic acid; and astringent-taste agents, typically catechins and protocyanidin acids, can be used to achieve the same effect.

Next, another example of memory card in the first exemplary embodiment is described.

Figure 6A:
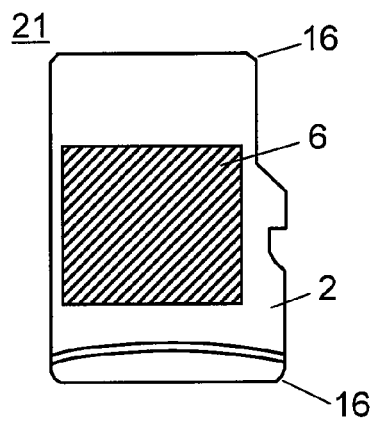
FIG. 6A is a front view of another example of memory card in accordance with the first exemplary embodiment of the present invention.
Figure 6B:
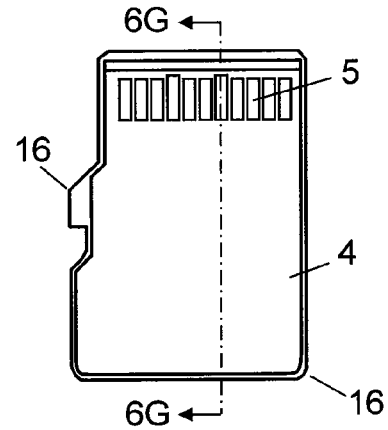
FIG. 6B is a rear view of another example of memory card in accordance with the first exemplary embodiment of the present invention.
Figure 6C:
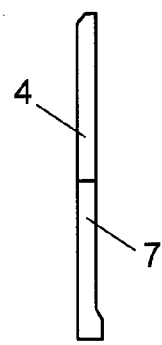
FIG. 6C is a left side view of another example of memory card in accordance with the first exemplary embodiment of the present invention.
Figure 6D:
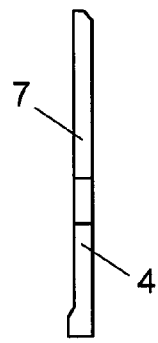
FIG. 6D is a right side view of another example of memory card in accordance with the first exemplary embodiment of the present invention.
Figure 6E:
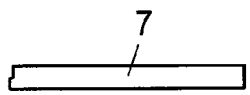
FIG. 6E is a bottom side view of another example of the memory card in accordance with the first exemplary embodiment of the present invention.
Figure 6F:
FIG. 6F is a top side view of another example of the memory card in accordance with the first exemplary embodiment of the present invention.
Figure 6G:
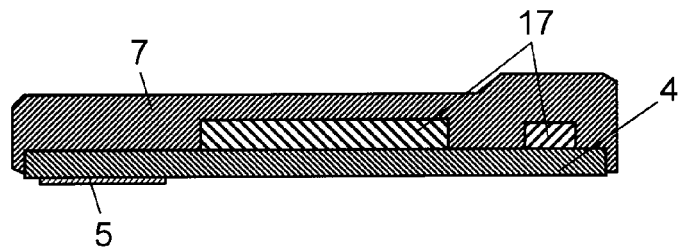
FIG. 6G is a sectional view taken along line 6G-6G in FIG. 6B.

FIGS. 6A to 6G show an appearance of another example of memory card in the first exemplary embodiment. FIG. 6A is a front view, FIG. 6B is a rear view FIG. 6C is a left side view, FIG. 6D is a right side view, FIG. 6E is a bottom side view, FIG. 6F is a top side view, and FIG. 6G is a sectional view taken along line 6G-6G in FIG. 6B.

Memory card 21 shown in FIGS. 6A to 6G is further smaller than memory card 1. For example, the size of memory card 21 is 11 mm wide, 15 mm long, and 1.0 mm thick. In general, this memory card is called a 'micro SD memory card' (micro secure digital memory card). This memory card 21 has a shape and size determined in accordance with the standard, same as memory card 1, and is broadly used in mobile devices such as mobile phone terminals.

In memory card 21, as shown in FIG. 6G, mounting-components 17 including a semiconductor chip and chip components are placed on at least one face of circuit board 4, which is built into casing 7. Multiple electrode terminals 5 for transmitting electrical signals to and from outside are also provided on circuit board 4. The other face of circuit board 4 with electrode terminals 5 is exposed from one face of casing 7. Casing 7 of memory card 21 is made by injection molding of thermoplastic resin typically polycarbonate/ABS.

Memory card 21 is completed by bonding circuit board 4, on which mounting-components 17 including a semiconductor chip are mounted, and casing 7.

Memory card 21 as manufactured above has logo area 6 on at least one face of casing 7 and circuit board 4, as shown in FIG. 6A. This makes each memory card, including its type, identifiable.

As shown in FIGS. 6A and 6B, the roughened area made typically of the concavo-convex pattern is formed on casing 7 or at least a part of circuit board 4 excluding electrode terminals 5, same as that in memory card 1. The bittering agent is embedded in concavities of this roughened area. The concave-convex pattern of the roughened area and the retention method of the bittering agent are the same as that described in memory card 1, and thus their description is omitted here.

In memory card 21 in this exemplary embodiment, the bittering agent retained in the roughened area, same as that in memory card 1, causes immediate spitting-out of the memory card if a child places the memory card in his/her mouth. This prevents accidental ingestion. In addition, retention of the bittering agent in the concavities of the roughened area suppresses any loss of the bittering agent due to transfer to the hand or dropping, and thus the effect can be reliably maintained over a long period of time. Furthermore, since the bittering agent is not altered or degraded by heat during molding of the casing, an inexpensive and reliable memory card is achievable.

This exemplary embodiment refers to the memory card in which its roughened area is provided on the surface of casing or the exposed surface of the circuit board. However, the position of roughened area is not limited. For example, as shown in FIGS. 1A, 6A, and 6B, the roughened area may be formed at corner 16 of the substantially rectangular casing or the circuit board. This enables a faster contact of the roughened area retaining the bittering agent in the mouth, causing spitting-out in an even shorter period. The risk of accidental ingestion can thus be further reduced.

Second Exemplary Embodiment

A memory card in the second exemplary embodiment of the present invention is described below with reference to FIGS. 7A to 7D. Memory card 201 in the second exemplary embodiment differs from memory card 1 in the first exemplary embodiment in that a bittering agent is retained in a bonding part of the casings. The other structures are the same.

FIG. 7A is a schematic view of memory card 201. The top drawing is a plan view, and the bottom drawing is a top side view. FIGS. 7B to 7D are partial magnified sectional views of the bonding part of the casings that has a specific structure for retaining the bittering agent. More specifically, as shown in FIG. 7B, a notch open to the outside is provided on the boundary face of at least one bonding part of casing 207, including upper casing 202 and lower casing 203. Accordingly, space 216 is formed when bonding upper casing 202 and lower casing 203. Bittering agent 211 is embedded and retained inside space 216 by applying bittering agent 211 at the edge of the bonding part of the casing of memory card 201.

Since bittering agent 211 can be embedded in space 216 at the bonding part of upper case 202 and lower case 203, the bittering agent will not be removed if the memory card is touched on the outside by the hand. As a result, accidental ingestion of memory card 201 is reliably preventable over a long period of time.

As shown in FIG. 7C, for example, an L-shaped notch open to the outside is provided on the boundary of bonding part of at least upper casing 202 or lower casing 203, and space 216 is formed when bonding upper casing 202 and lower casting 203. Alternatively, as shown in FIG. 7D, for example, an L-shaped notch open to the outside is provided on the boundary face of at least one bonding part of upper casing 202 and lower casing 203, and a groove is also formed in the other casing so as to configure space 216 when upper casing 202 and lower casing 203 are bonded. This enables the retention of a large amount of bittering agent 211, and thus realizes a memory card that can prevent accidental ingestion for an even longer period of time.

In addition, even when insert-molding is applied to the circuit board using thermoplastic resin to form the casing, a concavity may be provided in advance at an edge of the casing to form a space. This also achieves the same effect.

Third Exemplary Embodiment

A memory card in the third exemplary embodiment of the present invention is described below with reference to FIGS. 8A to 8D. Memory card 301 in the third exemplary embodiment differs from memory card 21 in the first exemplary embodiment in that a bittering agent is retained in a bonding part between the casing and the circuit board. Other structures are the same.

Figure 8A:
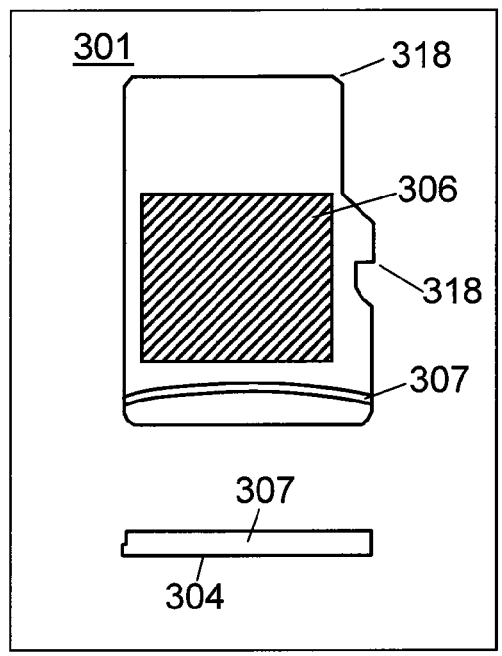
FIG. 8A is a front view and a bottom side view of a memory card in accordance with a third exemplary embodiment of the present invention.
Figure 8B:
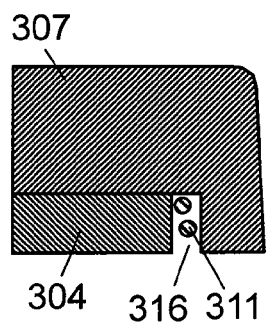
FIG. 8B is a partial magnified sectional view of a bonding part between a casing and a circuit board that has a specific structure for retaining a bittering agent in the memory card in accordance with the third exemplary embodiment of the present invention.
Figure 8C:
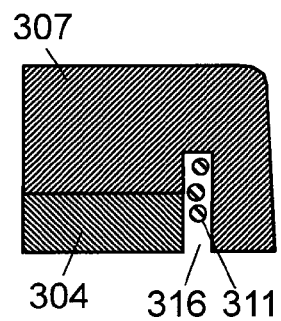
FIG. 8C is a partial magnified sectional view of the bonding part between the casing and the circuit board that has a specific structure for retaining the bittering agent in the memory card in accordance with the third exemplary embodiment of the present invention.
Figure 8D:
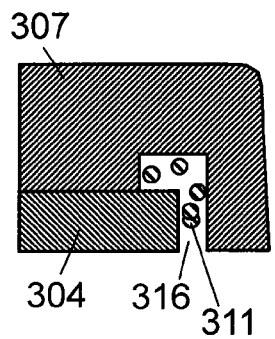
FIG. 8D is a partial magnified sectional view of the bonding part between the casing and the circuit board that has a specific structure for retaining the bittering agent in the memory card in accordance with the third exemplary embodiment of the present invention.

FIG. 8A is a schematic view of memory card 301. A top drawing is a plan view, and a bottom drawing is a top side view. FIGS. 8B to 8D are partial magnified sectional views of the bonding part of the casing and the circuit board that has a specific structure for retaining the bittering agent. More specifically, space 316 is formed between an end face of circuit board 304 and casing 307 when circuit board 304 and casing 307 are bonded, as shown in FIG. 8B. Bittering agent 311 is applied to an edge of the bonding part of casing 307 of memory card 301 so that bittering agent 311 is embedded and retained inside space 316.

Bittering agent 311 can thus be retained in space 316 formed between end faces of casing 307 and circuit board 304. Accordingly, bittering agent 311 is not removed even if it is touched on the outside by the hand. As a result, accidental ingestion of memory card 301 is reliably preventable over a long period of time.

As shown in FIG. 8C, the concavity may be provided on casing 307 to form space 316. Or, as shown in FIG. 8D, L-shaped space 316, for example, may be configured by the end faces of casing 307 and circuit board 304. These enable retention of a larger amount of bittering agent 311, and thus realizes memory card 301 that can prevent accidental ingestion over an even longer period.

In the memory card described in the second exemplary embodiment and the third exemplary embodiment, as shown in FIG. 7A or FIG. 8A, a space may be formed at corner 218 or 318 of the substantially rectangular casing or circuit board. This makes the bittering agent retained in the space easier to contact inside the mouth, causing spitting-out of the memory card in an even shorter period. Accordingly, the risk of accidental ingestion can be further reduced.

Fourth Exemplary Embodiment

A memory card in the fourth exemplary embodiment is described with reference to FIGS. 9 and 10. Same as the first exemplary embodiment, a mini SD memory card is used as an example in the description below.

Figure 9:
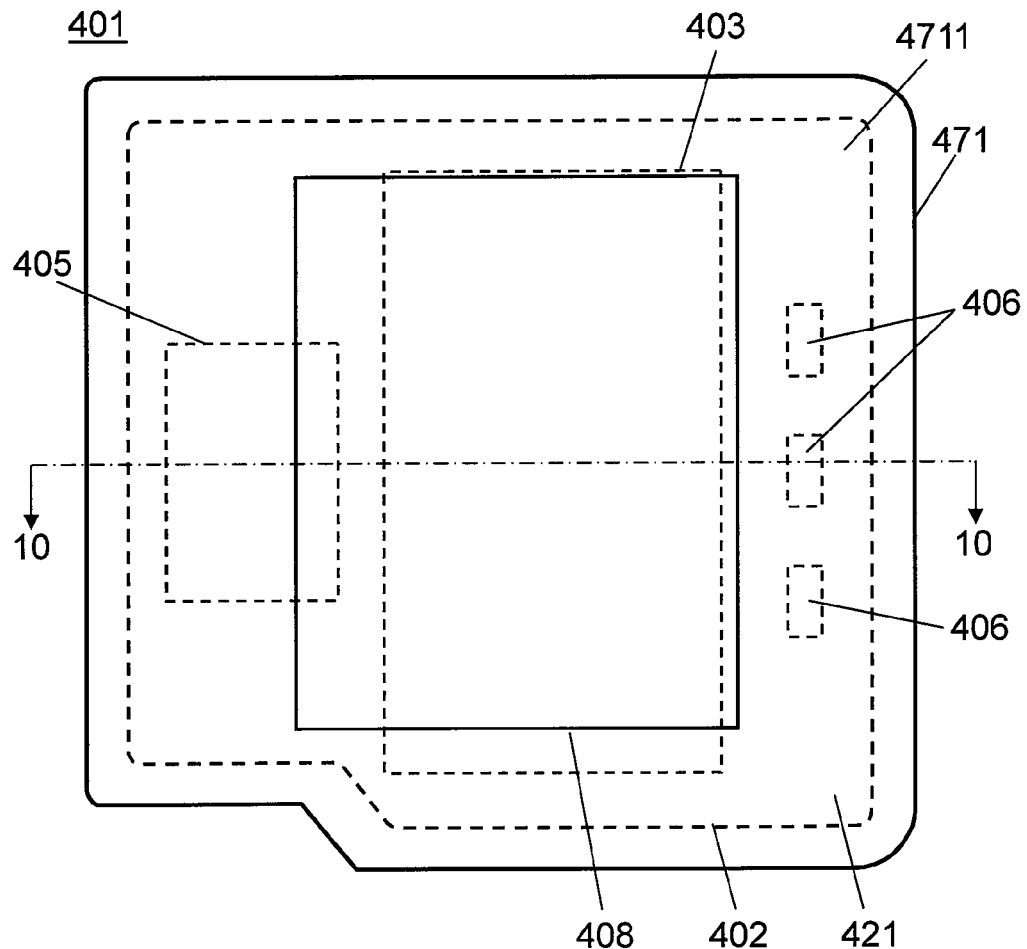
FIG. 9 is a plan view of a structure of a memory card in accordance with a fourth exemplary embodiment of the present invention.

FIG. 9 is a plan view illustrating the structure of memory card 401 in the fourth exemplary embodiment of the present invention. FIG. 10 is a sectional view taken along line 10-10 in FIG. 9. For the sake of convenience, an upper part and lower part of FIG. 10 are called the top side and bottom side of memory card 401, respectively.

Figure 10:
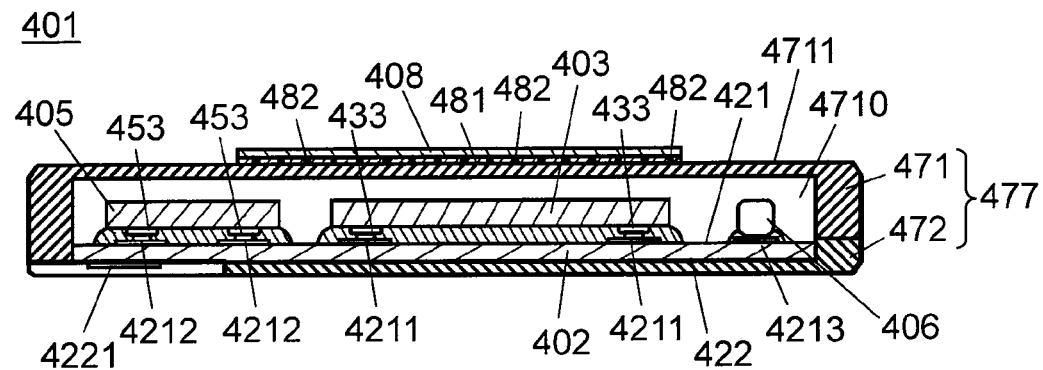
FIG. 10 is a sectional view taken along line 10-10 in FIG. 9.

As shown in FIGS. 9 and 10, memory card 401 includes substantially rectangular circuit board 402; mounting-components including first semiconductor chip 403 and second semiconductor chip 405 that are flip-chip mounted on main face 421 at the top side of circuit board 402 (hereafter referred to as "top face") via a sealing resin layer such as a non-conductive resin film, and chip components 406 such as a resistor mounted on top face 421 of circuit board 402 typically by solder; casing 477 including upper casing 471 that covers first semiconductor chip 403, second semiconductor chip 405, and chip components 406 and lower casing 472 that covers a part of main face 422 at the bottom side of circuit board 402 (hereafter referred to as "bottom face"); and identification part 408 attached to the outer surface 4711 of upper casing 471 via adhesive layer 481. In FIG. 10, thicknesses of identification part 408 and adhesive layer 481 are illustrated thicker than actual sizes. In the description below, a label is used as an example of identification part 408, and the same reference mark is given.

As shown in FIG. 10, electrode 4211 where first semiconductor chip 402 is bonded, electrode 4212 where second semiconductor chip 405 is bonded, and electrode 4213 where chip component 406 is bonded are provided on top face 421 of circuit board 402. Multiple electrode terminals 4221 are provided on bottom face 422 of circuit board 402 for connection with external electronic equipment. Electrode terminals 4221 are electrically connected to wiring (not illustrated) provided on top face 421 via through holes (not illustrated) coupling from bottom face 422 to top face 421 of circuit board 402.

First semiconductor chip 403 is a memory chip storing information, and second semiconductor chip 405 is a control chip for controlling first semiconductor chip 403. First semiconductor chip 403 is bonded to electrode 4211 on circuit board 402 via ball bump 433 (a so-called "stud bump," and is hereafter simply referred to as a "bump"), and second semiconductor chip 405 is also bonded to electrode 4212 of circuit board 402 via bump 453.

Upper casing 471 and lower casing 472 are molded parts made by insert-molding typically using thermoplastic resin or thermosetting resin. Upper casing 471 has concavity 4710 for housing first semiconductor chip 403, second semiconductor chip 405, and chip components 406. Upper casing 471 is attached to top face 421 of circuit board 402 via an opening of this concavity 4710

Memory card 401 also has adhesive layer 481 containing bittering agent 482 between label 408 and upper casing 471. Bittering agent 482 is a flavored substance that generates a bitter or hot taste when placed in the mouth, same as that in the first exemplary embodiment. For example, bittering agent 482 is made of a natural compound or synthetic compound that causes spitting-out by bitterness spreading in the mouth. Considering the possibility of a child putting the memory card in his/her mouth, bittering agent 482 is preferably made of a substance that can be used as food additive. More specifically, bittering agent 482 is typically bittering agent 482, hot-tasting agents, acidulating agents, or astringent-taste agents described in the first exemplary embodiment.

In memory card 401 in this exemplary embodiment, bittering agent 482 is retained between label 408 and upper casing 471. When memory card 401 is accidentally placed in a mouth, bittering agent 482 dissolves in the mouth, and causes emetic effect. As a result, this causes spitting-out of memory card 401 from the mouth, preventing accidental ingestion of memory card 401.

In addition, bittering agent 482 is covered with label 408 in memory card 401 in this exemplary embodiment. Accordingly, removal of bittering agent 482 from memory card 401 due to transfer of bittering agent to the user's fingertip can be prevented. Accordingly, bittering agent 482 can be reliably retained on the surface of memory card 401 over a long period of time.

In memory card 401 of the present invention, adhesive layer 481 containing bittering agent 482 is applied to an adhesion face of label 408 or an area on surface 4711 of upper casing 471 where label 408 will be attached, and then label 408 is attached to upper casing 471. Accordingly, there is almost no need to change the manufacturing steps of memory card 401. A memory card that can prevent accidental ingestion is thus achievable using conventional manufacturing steps.

Fifth Exemplary Embodiment

A memory card in the fifth exemplary embodiment of the present invention is described with reference to FIGS. 11 and 12. Same as the first exemplary embodiment, a mini SD memory card is used as an example in the description below.

Figure 11:
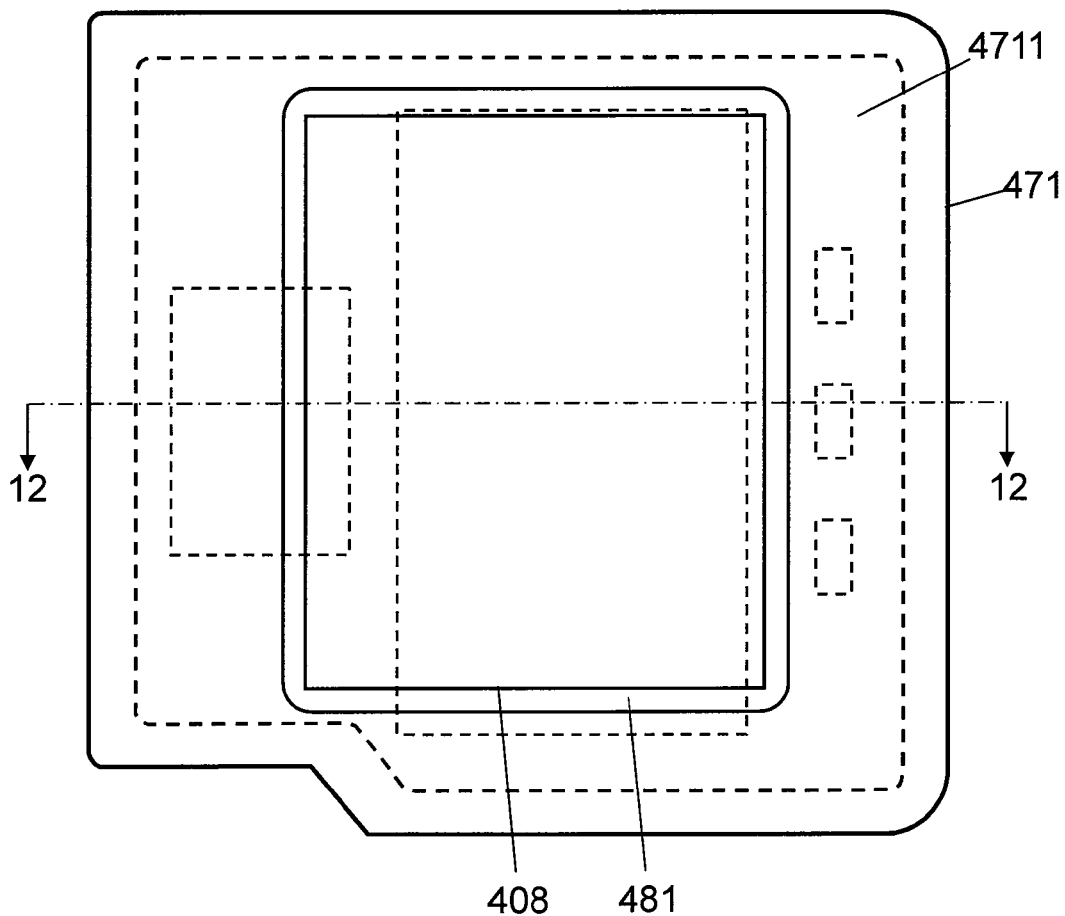
FIG. 11 is a plan view of a structure of a memory card in accordance with a fifth exemplary embodiment of the present invention.
Figure 12:
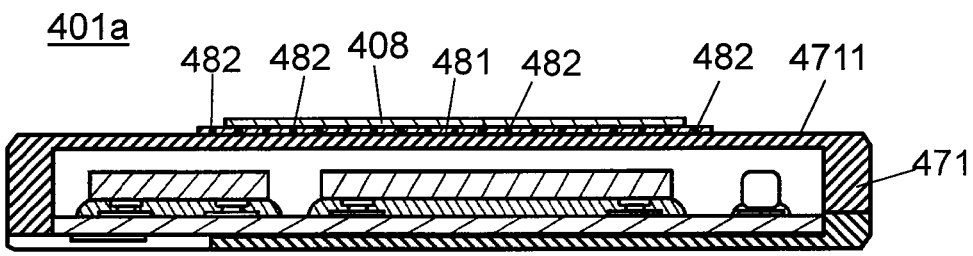
FIG. 12 is a sectional view taken along line 12-12 in FIG. 11.

FIG. 11 is a plan view illustrating the structure of memory card 401a, and FIG. 12 is a sectional view taken along line 12-12 in FIG. 11.

Memory card 401a differs from memory card 401 in the fourth exemplary embodiment in that adhesive layer 481 containing bittering agent 482 is formed up to an area around identification part 408 in addition to an area between identification part 408 and upper casing 471. Other structures are the same as those in FIGS. 9 and 10, so the same reference marks are given. As in the fourth exemplary embodiment, a label is used as an example of identification part 408, and the same reference mark is given.

In memory card 401a, as shown in FIGS. 11 and 12, adhesive layer 481 containing bittering agent 482 is applied to an area on surface 4711 of upper casing 471 where label 408 will be bonded and its surrounding area, after which label 408 is bonded to upper casing 471.

In memory card 401a in this exemplary embodiment, bittering agent 482 is retained on upper casing 471, as in the fourth exemplary embodiment. Accordingly, bittering agent 482 dissolves in the mouth if memory card 401a is accidentally put in the mouth, causing memory card 401a to be spat out immediately and thus preventing its accidental ingestion. In addition, since bittering agent 482 is retained between label 408 and upper casing 471, bittering agent 482 covered with label 408 is prevented from being removed from memory card 401 by attaching to the user's fingertip. Accordingly, bittering agent 482 can be reliably retained on the surface of memory card 401a over a long period of time.

In memory card 401a in this exemplary embodiment, bittering agent 482 is also provided around label 408 in an exposed manner for direct retention. This enables the rapid dissolution of bittering agent 482 if memory card 401a is placed in the mouth, causing immediate spitting-out. As a result, accidental ingestion of memory card 401a is reliably preventable.

Sixth Exemplary Embodiment

A memory card in the sixth exemplary embodiment of the present invention is described with reference to FIGS. 13 to 15. Same as the first exemplary embodiment, a mini SD memory card is used as an example in the description below.

Figure 13:
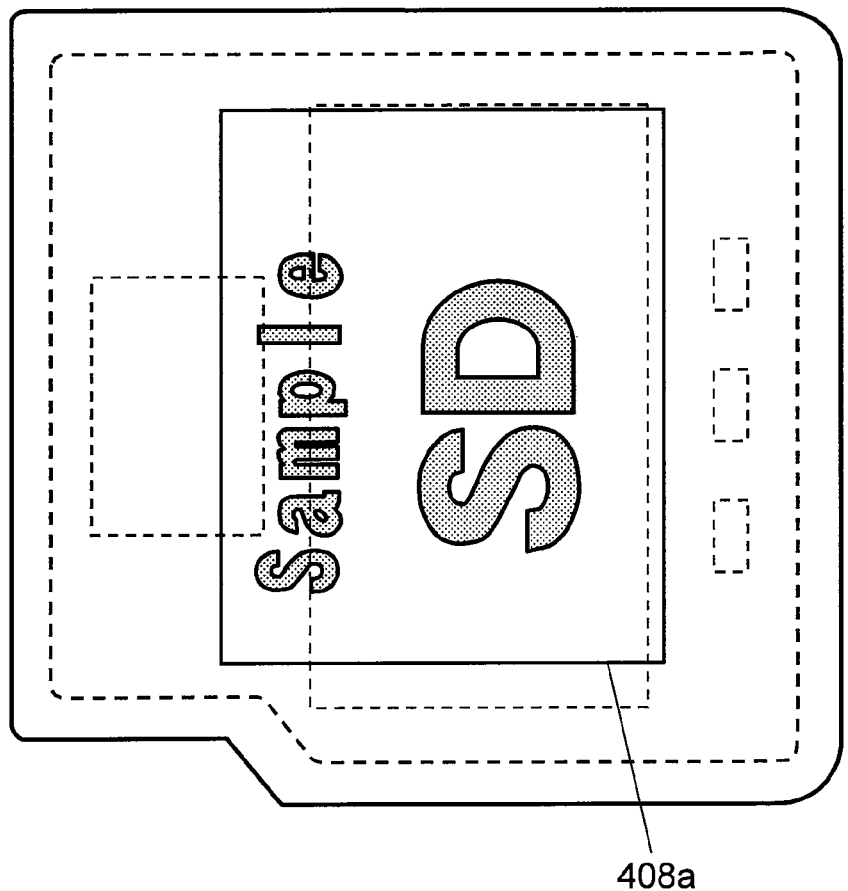
FIG. 13 is a plan view of a structure of a memory card in accordance with a sixth exemplary embodiment of the present invention.

FIG. 13 is a plan view illustrating a structure of memory card 401b in the sixth exemplary embodiment of the present invention. FIG. 14 is a plan view partially magnifying identification part 408a of memory card 401b in FIG. 13. FIG. 15 is a sectional view further magnifying a part of identification part 408a shown in FIG. 14. In the description below, a label is used as an example of identification part 408, and the same reference mark is given.

Figure 14:
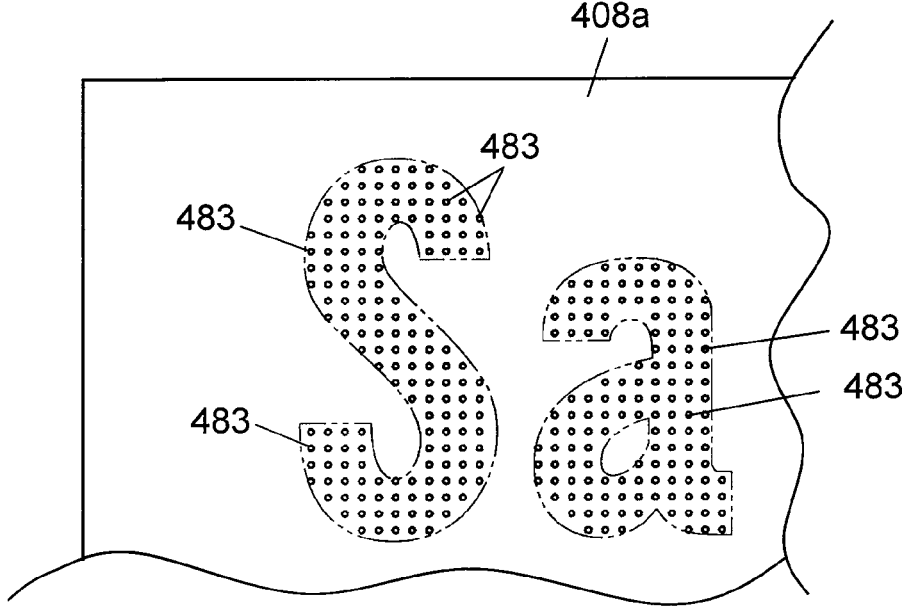
FIG. 14 is a plan view magnifying a part of an identification part in FIG. 13.
Figure 15:
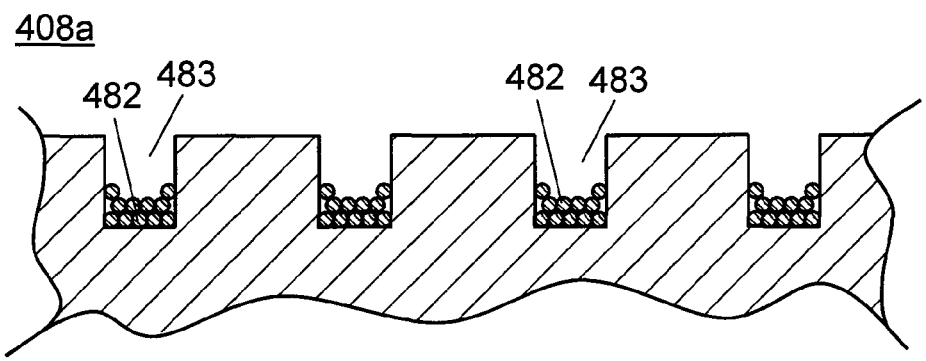
FIG. 15 is a sectional view further magnifying a part of the identification part in FIG. 14.

As shown in FIGS. 13 to 15, memory card 401b has label 408a where multiple fine concavities 483 are formed on its surface so as to retain bittering agent 482 in these fine concavities 483. Other structures are the same as that in FIGS. 9 and 10, and thus the same reference marks are given in the description. In FIG. 14, fine concavities 483 are illustrated broader than the actual sizes.

As shown in FIG. 14, memory card 401b has indication on label 408a (e.g. characters, symbols, or marks indicating the name of the memory card, its storage capacity, logo, and so on) written by multiple fine concavities 483. In FIG. 14, the outline of indication written by multiple fine concavities 483 is shown by the chain double-dashed line. Fine concavities 483 of memory card 401b are formed on the surface of label 408a by pushing corresponding fine convexes. Fine concavities 483 may also be formed by sandblasting method.

Then, bittering agent 482 is provided in fine concavities 483 shown in FIG. 15 using the next method. First, a solution, in which bittering agent 482 such as denatonium benzoate is dissolved in a solvent such as alcohol, is provided in multiple fine concavities 483 typically using pad transfer method, inkjet method, or dispensing method. Then, the solvent such as alcohol is dried by heating with hot air so as to fixate bittering agent 482 in fine concavities 483.

In memory card 401b in this exemplary embodiment, bittering agent 482 is retained in fine concavities 483 of label 408a. This enables prevention of accidental ingestion of memory card 401b by the emetic effect of bittering agent 482 same as that in the fourth exemplary embodiment. In addition, since bittering agent 482 is retained in fine concavities 483 of label 408a, attachment of bittering agent 482 to the user's fingertip can be prevented. Accordingly, bittering agent 482 can be reliably retained in memory card 401b over a long period of time.

In memory card 401b in this exemplary embodiment, multiple fine concavities 483 formed in label 408a configure indication on label 408a. Accordingly, there is no need to additionally form fine concavities for retaining bittering agent 482 in label 408a. Memory card 41b can thus be easily manufactured using conventional manufacturing steps.

Seventh Exemplary Embodiment

A memory card in the seventh exemplary embodiment of the present invention is described with reference to FIGS. 16 and 17. Same as another example in the first exemplary embodiment, a micro SD memory card is used in the description below.

Figure 16:
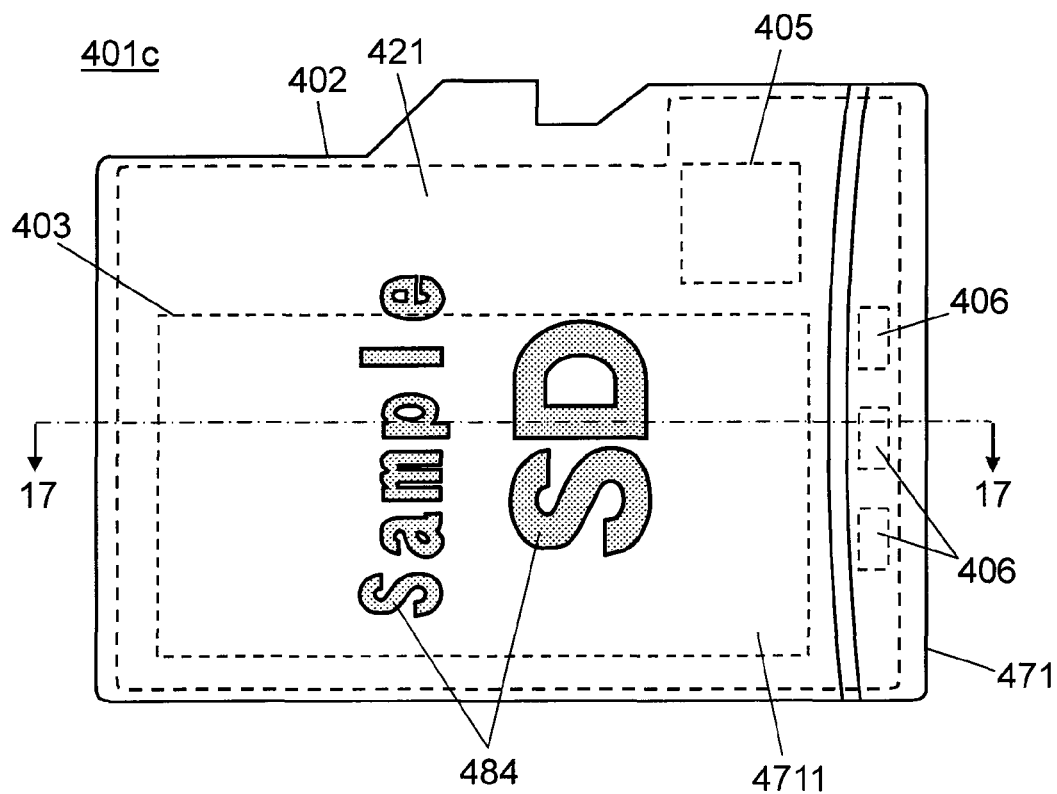
FIG. 16 is a plan view of a structure of a memory card in accordance with a seventh exemplary embodiment of the present invention.

FIG. 16 is a plan view illustrating the structure of memory card 401c in the seventh exemplary embodiment of the present invention. FIG. 17 is a sectional view taken along line 17-17 in FIG. 16.

Figure 17:
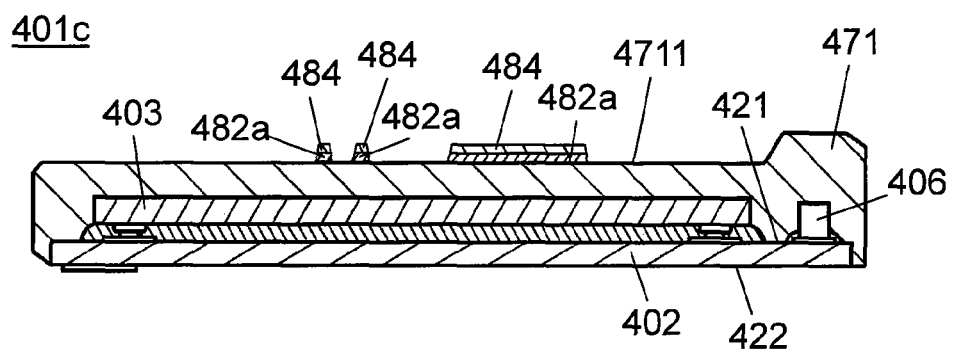
FIG. 17 is a sectional view taken along line 17-17 in FIG. 16.

As shown in FIGS. 16 and 17, memory card 401c includes substantially rectangular circuit board 402; mounting-components including first semiconductor chip 403 that is flip-chip mounted on top face 421 of circuit board 402 via a sealing resin layer, such as a non-conductive resin film, and chip components 406 such as a resistor mounted on top face 421 of circuit board 402 typically by solder; upper casing 471 covering first semiconductor chip 403 and chip components 406 at the side of top face 421 of circuit board 402; and identification part 484 formed on outer surface 4711 of upper casing 471. In the description below, a coloring layer is used as an example of identification part 484, and the same reference mark is given.

Upper casing 471 is formed by insert-molding typically using thermoplastic resin or thermosetting resin, and covers first semiconductor chip 403 and chip components 406 on circuit board 402.

As shown in FIG. 17, memory card 401c has adhesion layer 482a between coloring layer 484 and upper casing 471. This adhesion layer 482a is typically made of adhesive and contains a bittering agent. In FIG. 17, thicknesses of coloring layer 484 and adhesion layer 482a are illustrated thicker than actual sizes. As shown in FIG. 16, coloring layer 484 is typically an ink layer printed on upper casing 471, and provides indication (e.g. characters, symbols or marks of the name of memory card 401c, its storage capacity, logo, and so on) on upper casing 471.

In memory card 401c in this exemplary embodiment, the bittering agent is retained in adhesion layer 482a between coloring layer 484 and upper casing 471 so as to prevent accidental ingestion of memory card 401 by causing the emetic effect of the bittering agent. In addition, since adhesion layer 482a containing the bittering agent is covered with coloring layer 484, attachment of the bittering agent to the user's fingertip can be prevented. Accordingly, the bittering agent can be reliably retained on memory card 401c over a long period of time.

In memory card 401c in this exemplary embodiment, coloring layer 484 is indication on upper casing 471. Accordingly, there is no need to additionally form a coating layer, for example, to cover adhesion layer 482a containing the bittering agent on upper casing 471. Memory card 401c can thus be manufactured using a conventional manufacturing method without making manufacturing steps complicated. In addition, coloring layer 484 can be formed by printing. This also simplifies manufacturing steps of memory card 401c.

Figure 18:
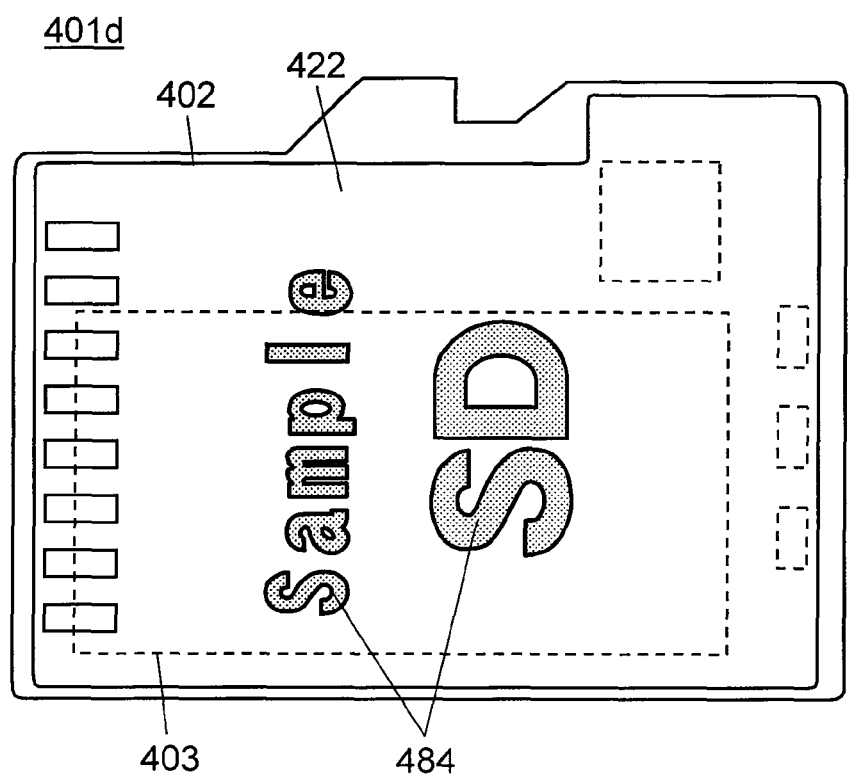
FIG. 18 is a plan view illustrating a structure of another example of memory card in accordance with the seventh exemplary embodiment of the present invention.

Memory card 401c in this exemplary embodiment refers to an example of providing coloring layer 484 on upper casing 471 via adhesion layer 482a containing the bittering agent. However, the present invention is not limited to this structure. FIG. 18 shows another example of memory card 401d in this exemplary embodiment. Coloring layer 484 is formed on bottom face 422 of circuit board 402 opposite to the face where semiconductor chip 403 is mounted via an adhesion layer (not illustrated), and the bittering agent is retained in the adhesion layer. Also in this case, the same effect is achievable. Memory card 401d also refers to the case of providing coloring layer 484 on circuit board 402 via adhesion layer 482a containing the bittering agent. However, the present invention is not limited to this structure. For example, same as in the fourth exemplary embodiment, a label may be attached via the adhesive layer containing the bittering agent.

Still more, memory card 401c in this exemplary embodiment refers to the use of the ink layer as coloring layer 484. However, the present invention is not limited to the ink layer. For example, a pre-colored resin may be used as coloring layer 484.

Still more, memory card 401c, in this exemplary embodiment refers to an example of integrating first semiconductor chip 403 into upper casing 471 by insert-molding. However, the present invention is not limited to this structure. For example, upper casing 471 may be molded as a cover using resin in advance, and this cover may be attached to circuit board 402 as upper casing 471.

It is apparent that the present invention is not limited to the above description of the exemplary embodiments. Diverse modifications and exchange of structures are also applicable.

In other words, the memory card in the fourth and fifth exemplary embodiments refer to adhesive layer 481 containing bittering agent 482. However, the present invention is not limited to this adhesive layer. For example, bittering agent 482 may be applied to an area where label 408 or 408a will be bonded and its surrounding area on surface 4711 of upper casing 471, and then label 408 or 408a to which adhesive is applied is bonded to the attachment area on upper casing 471.

Still more, the memory card in the fourth and fifth exemplary embodiments refer to an example of providing label 408 or 408a on the outer surface of upper casing 471. However the present invention is not limited to this structure. For example, label 408 or 408a is attached to the outer surface of lower casing 472, and bittering agent 482 may be retained between label 408 or 408a and lower casing 472.

The memory card in each exemplary embodiment refers to flip-chip mounting of first semiconductor chip and second semiconductor chip onto circuit board 402. However, the present invention is not limited to this structure. For example, they may be mounted on the circuit board using an anisotropic resin film, anisotropic resin paste, or non-conductive resin paste. In addition, the first semiconductor chip and the second semiconductor chip may be mounted by soldering or wire-bonding.

The memory card in each exemplary embodiment refers to an example in which the memory chip or control chip is mounted on the circuit board. However, the present invention is not limited to memory chips or control chips. For example, a semiconductor chip such as an application-specific integrated circuit (ASIC) may be mounted on circuit board 402. In addition, a semiconductor chip also acting as a memory and controller for controlling other memory chips, in addition to information storage, may be mounted, instead of the control chip. In this case, a semiconductor chip with a fully semiconductive function is not needed as long as it has a partial semiconductive function.

The memory card in each exemplary embodiment refers to a mini SD memory card or micro SD memory card. However, the present invention is not limited to these cards. The present invention is applicable to card-type recording media with any shape other than an SD memory card. For example, the present invention is also applicable to a stick-type memory card.

INDUSTRIAL APPLICABILITY

The memory card of the present invention prevents accidental ingestion by typically providing a bittering agent on the casing. This principle is applicable to other technical fields, including small electronic equipment, small electronic components, and small components in addition to memory cards.

The invention claimed is:

1. A memory card comprising:
   a circuit board;
   a component mounted on a main face of the circuit board; and
   a casing covering at least the main face of the circuit board and the component,
   wherein a roughened area of average roughness of 0.1 μm or more to 100 μm or less is provided in a logo area of the casing, and only a bittering agent is retained in the roughened area.

2. The memory card of claim 1, wherein the roughened area has a pearskin pattern.

3. The memory card of claim 1, wherein the roughened area has a groove formed on one of the casing and the exposed part of the circuit board.

4. The memory card of claim 3, wherein the groove is a fine linear groove formed on one of the casing and the exposed part of the circuit board.

5. The memory card of claim 1, wherein the roughened area has a foamed concavo-convex pattern formed on one of the casing and the exposed part of the circuit board.

6. The memory card of claim 1, wherein the roughened area is provided on a corner of one of the casing and the circuit board.

7. The memory card of claim 1, wherein average roughness Ra of the roughened area is not less than 0.1 μm and not greater than 100 μm.

8. A memory card comprising:
   a circuit board;
   a component mounted on a main face of the circuit board;
   a casing covering at least the main face of the circuit board and the component; and
   an identification part attached to one of the casing and the circuit board,
   wherein only a bittering agent is retained in one of between the identification part and the casing, between the identification part and the circuit board, and on the casing around the identification part or on the circuit board.

9. The memory card of claim 8, wherein the identification part is one of a label and a coloring layer.

10. The memory card of claim 9, wherein an adhesive layer formed in the label contains the bittering agent.

11. The memory card of claim 9, wherein the bittering agent is retained in a fine concavity formed on a surface of the label.

12. The memory card of claim 9, wherein an adhesion layer formed in the coloring layer contains the bittering agent.

* * * * *